(12) United States Patent
Nguyen et al.

(10) Patent No.: US 6,744,289 B2
(45) Date of Patent: *Jun. 1, 2004

(54) CLOCK DIVIDER CIRCUIT WITH DUTY CYCLE CORRECTION AND MINIMAL ADDITIONAL DELAY

(75) Inventors: Andy T. Nguyen, San Jose, CA (US); Jack Siu Cheung Lo, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 57 days.

This patent is subject to a terminal disclaimer.

(21) Appl. No.: 10/193,070

(22) Filed: Jul. 10, 2002

(65) Prior Publication Data

US 2003/0048118 A1 Mar. 13, 2003

Related U.S. Application Data

(63) Continuation-in-part of application No. 09/942,230, filed on Aug. 28, 2001, now Pat. No. 6,445,228.

(51) Int. Cl.[7] .............................. G06F 1/04; H03K 5/13
(52) U.S. Cl. ........................................ 327/115; 327/117
(58) Field of Search .............................. 327/115, 117, 327/113, 105, 122; 377/47, 52

(56) References Cited

U.S. PATENT DOCUMENTS

| | | | |
|---|---|---|---|
| 4,686,386 A | 8/1987 | Tadao | 327/143 |
| 5,065,415 A | 11/1991 | Yamashita | 377/52 |
| 5,675,273 A | 10/1997 | Masleid | 327/156 |
| 5,684,418 A | 11/1997 | Yanagiuchi | 327/99 |
| 5,914,996 A | 6/1999 | Huang | 377/39 |
| 6,057,709 A * | 5/2000 | Hesley | 326/54 |
| 6,061,418 A | 5/2000 | Hassoun | 377/47 |
| 6,104,219 A * | 8/2000 | Bakatullah et al. | 327/115 |
| 6,133,796 A | 10/2000 | Monk | 327/517 |
| 6,229,357 B1 * | 5/2001 | Niar et al. | 327/115 |
| 6,239,627 B1 | 5/2001 | Brown et al. | 327/116 |
| 6,496,045 B1 * | 12/2002 | Nguyen | 327/115 |

FOREIGN PATENT DOCUMENTS

| | | |
|---|---|---|
| EP | 0 385 567 A2 | 5/1990 |
| JP | 0236856 | 3/1990 |

\* cited by examiner

*Primary Examiner*—Dinh T. Le
(74) *Attorney, Agent, or Firm*—Lois D. Cartier

(57) ABSTRACT

A clock divider circuit that adds little additional delay on the clock path. Each rising and falling edge of an input clock signal triggers a pulse from a pulse generator circuit. These pulses are passed to a control circuit. True and complement versions of the input clock signal are provided to a multiplexer circuit. Under the direction of the control circuit, the multiplexer circuit passes selected rising edges of the true clock signal, and selected falling edges of the complement clock signal, to an output clock terminal of the clock divider circuit. When neither the true nor the complement clock signal is passed by the multiplexer, a keeper circuit retains the value already present at the output clock terminal.

27 Claims, 9 Drawing Sheets

US 6,744,289 B2

CLOCK DIVIDER CIRCUIT WITH DUTY CYCLE CORRECTION AND MINIMAL ADDITIONAL DELAY

FIELD OF THE INVENTION

The invention relates to clocking circuits for digital systems. More specifically, the present invention relates to a clock divider circuit with duty cycle correction that adds only a minimal delay to the clock path.

BACKGROUND OF THE INVENTION

Digital circuits such as board level systems and integrated circuit (IC) devices, including programmable logic devices (PLDs) and microprocessors, use clocking signals for a variety of reasons. For example, synchronous systems use global clock signals to synchronize various circuits across the board or IC device.

However, as the complexity of digital circuits increases, clocking schemes for synchronous systems become more complicated. Many complex digital circuits such as PLDs and microprocessors use multiple clock signals at different frequencies. For example, in some PLDs, some of the programmable logic blocks can be operated at a first clock frequency while other logic blocks are operated at a second clock frequency.

Multiple clock generating circuits can be used to generate the multiple clock signals. However, clock generating circuits typically consume a large amount of device or board space. Therefore, most systems use one clock generating circuit to generate a first clock signal and a specialized circuit to derive other clock signals from the first clock signal. For example, clock dividers are often used to generate clock signals of lower frequency from an input clock signal.

FIG. 1 shows a conventional clock divider 100 that receives an input clock signal ICLK and generates a divided-by-two clock signal CLKD2, a divided-by-four clock signal CLKD4, and a divided-by-eight clock signal CLKD8. (In the present specification, the same reference characters are used to refer to terminals, signal lines, and their corresponding signals.) Clock divider 100 comprises a 3-bit counter 110. Input clock signal ICLK is applied to the clock terminal of 3-bit counter 110. Counter 110 drives clock signals CLKD2, CLKD4, and CLKD8 on output terminals O0, O1, and O2, respectively. Output terminals O0 through O2 provide the least significant bit through the most significant bit of 3-bit counter 110, respectively.

FIG. 1A is a timing diagram for clock divider 100 of FIG. 1. As can easily be seen from FIG. 1A, if input clock signal ICLK has a clock period P, then divide-by-two clock signal CLKD2 has a clock period of 2P. Similarly, divide-by-four clock signal CLKD4 has a period of 4P, and so forth. Thus, the frequency of clock signal CLKD2 is half the frequency of input clock signal ICLK, the frequency of clock signal CLKD4 is one-fourth the frequency of signal ICLK, and so forth.

As illustrated by FIGS. 2 and 3, including a clock divider in an IC device typically carries a timing penalty, even when the clock divider is disabled. FIG. 2 shows a clock driver circuit 200 in an IC where a clock divider is not included. Clock driver circuit 200 includes a driver 202 that accepts an input clock signal from clock pad 201, and applies the signal to clock tree 203. FIG. 3 shows a second clock driver circuit 300 that includes an optional clock divider 303. The designer can either include clock divider 303 in the circuit, or bypass the clock divider, under the control of multiplexer 304.

FIG. 3 clearly shows that whether or not the clock divider is included in the clock path, there is an additional delay D310 in the circuit of FIG. 3 compared to that of FIG. 2. When clock divider 303 is bypassed, there is additional delay through signal line BYPASS and a propagation delay through multiplexer 304. When clock divider 303 is included in the circuit, the propagation delays of both clock divider 303 and multiplexer 304 are added to the clock path.

If a clock divider such as that shown in FIG. 1 is placed into the clock driver circuit of FIG. 3, the result is a clock tree driven by a flip-flop (from 3-bit counter 110 of FIG. 1) through a multiplexer (e.g., multiplexer 304 of FIG. 3). Clearly, neither a flip-flop nor an unbuffered multiplexer have the drive capability to drive a large clock tree—the resulting clock signal would be unacceptably slow and have a very high skew. Therefore, multiplexer 304 is typically buffered. The delay through the clock buffer is also added to the clock path.

FIG. 4 shows another optional capability that is often included in clock driver circuits, that of optionally inverting the input clock signal. Clock driver circuit 400 includes inverters 402, 405 and CMOS passgates 403, 404. A clock signal on clock pad 401 is provided to passgate 404, and also to passgate 403 through inverter 402. When select signal TRUE is high, the true (non-inverted) clock signal passes through passgate 404 to clock tree 406. When select signal TRUE is low, the complement (inverted) clock signal passes through passgate 403 to clock tree 406.

FIG. 5 shows a first known clock divider circuit 500 that has the capabilities of both FIGS. 3 and 4. Input clock signal CLKIN drives internal node INT either through passgate 503 (when select signal TRUE is high), or through inverter 501 and passgate 502 (when select signal TRUE is low). Thus, either the true or the complement version of input signal CLKIN is selected by select signal TRUE. Internal node INT then passes the selected signal to clock divider 505 and multiplexer 506. Multiplexer 506 selects the output of clock divider 505 when select signal DIV is high, and internal signal INT when select signal DIV is low.

As can be seen from FIG. 5, the fastest path through clock divider circuit 500 still includes the delay through passgate 503, internal node INT, and multiplexer 506.

FIG. 6 shows a second known clock divider circuit 600. Circuit 600 does not allow the inversion and division circuits to be used at the same time. There are three paths through clock divider circuit 600. A first, non-inverting path passes input clock signal CLKIN through passgate 605 when select signal SELTRUE is high. A second, inverting path passes input clock signal CLKIN through inverter 602 and passgate 604 when select signal SELCOMP is high. A third, non-inverting but divided path provides input clock signal CLKIN to clock divider 601, the output of which passes through passgate 603 when select signal SELDIV is high. At most one of select signals SELTRUE, SELCOMP, and SELDIV can be high at any given time.

The minimum path delay through clock divider circuit 600 is less than that of circuit 500 of FIG. 5, because only one passgate (605) is included in the fastest clock path. However, the delay through the fastest clock path is not necessarily as important as the delay through the slowest clock path, as is now explained.

Delay through a clock driver circuit can be an important parameter for IC designers. When known circuits are used, the additional delay due to the presence of a clock divider can be significant, e.g., about 500 picoseconds. Like most timing parameters, this delay is typically specified as a worst-case value, to ensure operation of the device under worst-case conditions. Therefore, even when the clock divider is bypassed, the specifications for the device are based on the worst case scenario, i.e., the delay when the clock divider is included. Therefore, the additional delay on the clock path due to the presence of a clock divider not only delays the clock signal, it also makes the IC device appear to be slower than it really is.

For these and other reasons, it is advantageous to provide a clock divider circuit having a shorter delay on the clock path than is achievable using known clock divider circuits.

SUMMARY OF THE INVENTION

The invention provides a novel clock divider circuit that adds little additional delay on the clock path. Each rising and falling edge of an input clock signal triggers a pulse from a pulse generator circuit. These pulses are passed to a control circuit. True and complement versions of the input clock signal are also provided to a multiplexer circuit. Under the direction of the control circuit, the multiplexer circuit passes selected rising edges of the true clock signal, and selected falling edges of the complement clock signal, to an output clock terminal of the clock divider circuit. When neither the true nor the complement clock signal is passed by the multiplexer, a keeper circuit retains the value already present at the output clock terminal.

According to one embodiment of the invention, every Nth rising edge on the true clock signal is passed to the output terminal, where N is an even integer. Every Nth falling edge on the complement clock signal is also passed to the output terminal. This embodiment provides a divide-by-N output signal. In one embodiment, the selected edges are separated by N/2 rising edges. Thus, this embodiment provides a duty-cycle-corrected output clock signal.

The clock divider circuit of the invention provides the capability to divide by any even integer, rather than being limited to powers of two as are many clock dividers. The delay through the clock divider circuit is the same, regardless of which even number is selected as the divisor.

In one embodiment of the invention, the control circuit is implemented as a counter followed by a decoder circuit. In other embodiments, the control circuit is a state machine having at least four states. In a first state, the state machine enables the "true" path through the multiplexer circuit and disables the "complement" path. In a second state, the state machine disables both paths through the multiplexer, and the next transition is to a third state. In the third state, the state machine enables the "complement" path through the multiplexer circuit and disables the "true" path. In the fourth state, the state machine disables both paths through the multiplexer, and the next transition is to the first state. In the second and fourth states, the keeper circuit maintains the existing value on the output terminal of the clock divider circuit.

An advantage of this circuit is that many of the delays typical of prior art clock dividers (D-flip-flop delays, combinational logic delays, and so forth) are shifted from the clock path to the path through the control circuit. Therefore, these delays are not on the clock path, i.e., not on the critical path for the clock divider circuit.

Another advantage is that by controlling the functionality of the control circuit, any even number (up to the capacity built into the control circuit) can be selected as the divisor for the clock divider circuit. Therefore, the clock divider circuit of the invention provides additional flexibility compared to many known clock dividers.

In one embodiment, the described clock divider circuit is included in a programmable logic device (PLD). In some such embodiments, the control circuit is programmable to select a divisor from a group of supported divisors. The divisor selection can be controlled, for example, using configuration data stored in static RAM (SRAM) cells included in the control circuit.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 7:
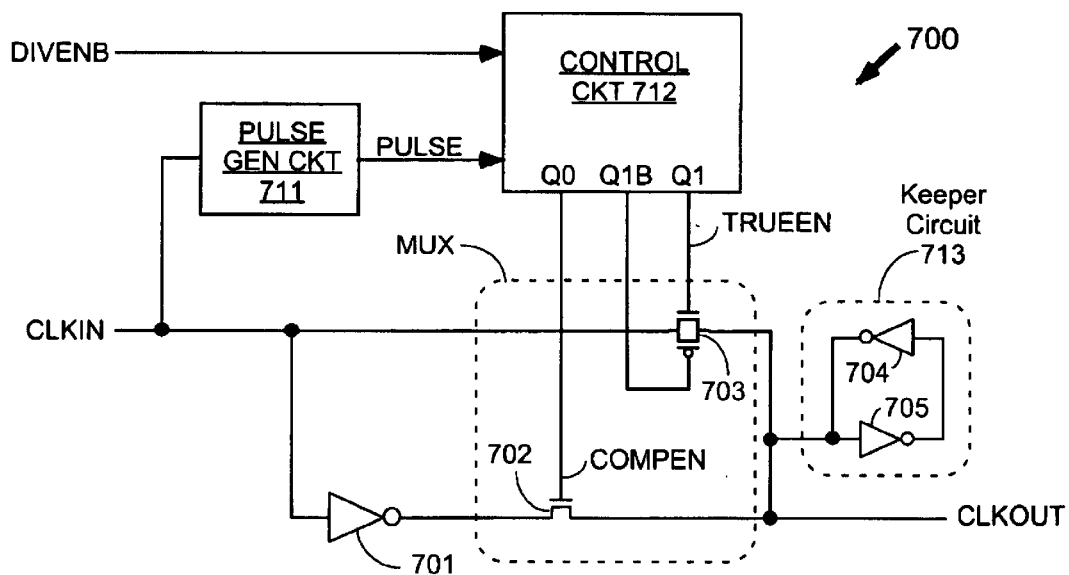
FIG. 7 is a block diagram of a clock divider circuit according to a first embodiment of the invention.

FIG. 7 shows a clock divider circuit 700 according to a first embodiment of the invention. Clock divider circuit 700 includes a pulse generator circuit 711, a control circuit 712, a multiplexer circuit MUX, an inverter 701, and a keeper circuit 713.

In the pictured embodiment, multiplexer circuit MUX includes two passgates 702 and 703 controlled by control circuit 712. In the pictured embodiment, passgate 703 is implemented as a CMOS passgate, because passgate 703 passes rising edges and a voltage drop on the rising edge can adversely impact the performance of the circuit. For example, a high value passed through only an N-channel transistor is dropped by one threshold voltage, therefore it might not be high enough to trip keeper circuit 713. However, passgate 702 is implemented as an N-channel transistor. Because only falling edges are passed through passgate 702, no loss of performance results. In other embodiments, other types of passgates are used for each of passgates 702 and 703. Other types of multiplexer circuits can also be substituted for multiplexer circuit MUX.

Keeper circuit 713 is coupled to output terminal CLKOUT. Keeper circuit 713 provides a weak output signal that reinforces the signal on output terminal CLKOUT. Therefore, the voltage level of the CLKOUT signal remains stored on the output terminal when neither of passgates 702 and 703 is providing a signal. One embodiment of keeper circuit 713 includes cross-coupled inverters 704, 705. However, keeper circuits are well known in the art, and any keeper circuit can be used in clock divider circuit 700, as long as it is weak enough to be overridden by each of passgates 702 and 703.

Figure 7A:
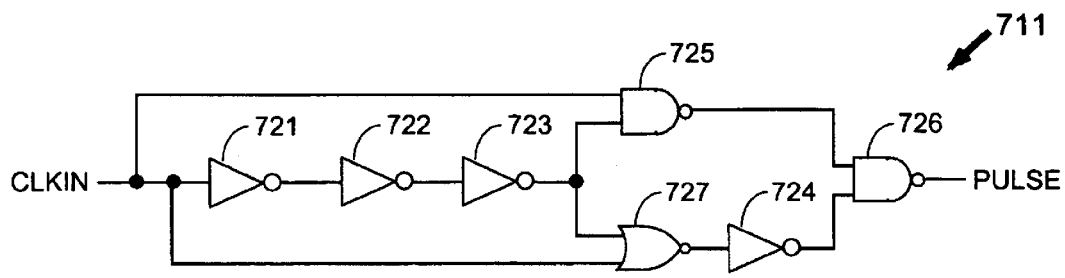
FIG. 7A shows one embodiment of a pulse generator circuit that can be used with the embodiment of FIG. 7.

Pulse generator circuit 711 provides an output pulse in response to each rising and falling edge of clock input signal CLKIN. (See, for example, the waveforms for signals CLKIN and PULSE provided in FIG. 7C.) Pulse generator circuit 711 can be implemented, for example, as shown in FIG. 7A. The embodiment shown in FIG. 7A includes inverters 721–724, NOR gate 727, and NAND gates 725–726.

Inverters 721–723 are coupled in series. The first inverter 721 in the series is driven by clock input signal CLKIN, and the final inverter 723 in the series drives both NAND gate 725 and NOR gate 727. Each of NAND gate 725 and NOR gate 727 is also driven by clock input signal CLKIN. NAND gate 726 is driven by NAND gate 725 and also by NOR gate 727 inverted by inverter 724. The output of NAND gate 726 is the PULSE signal, which is provided to control circuit 712 in FIG. 7.

Control circuit 712 controls passgates 702 and 703 to selectively pass rising edges on input clock signal CLKIN, and falling edges on the corresponding complementary signal. For example, to generate a divide-by-two clock signal, control circuit 712 enables passgate 703 to pass every other rising edge of input clock signal CLKIN, and enables passgate 702 to pass every other falling edge of the complementary clock signal provided by inverter 701.

Figure 1:
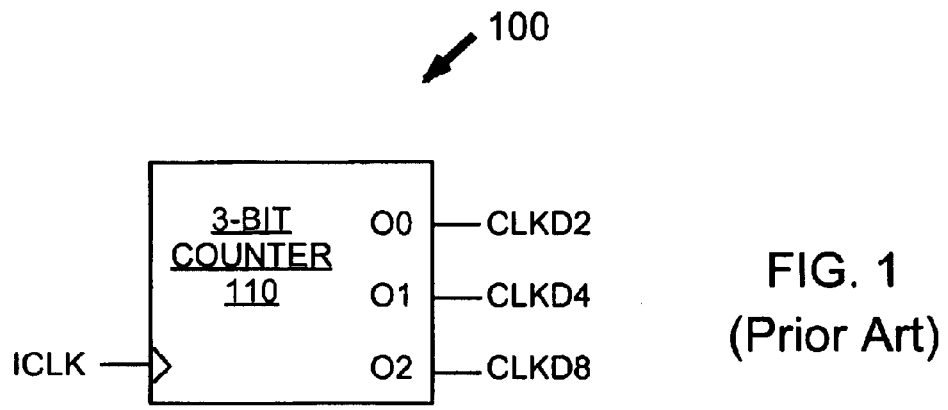
FIG. 1 is a block diagram of a conventional clock divider.
Figure 1A:
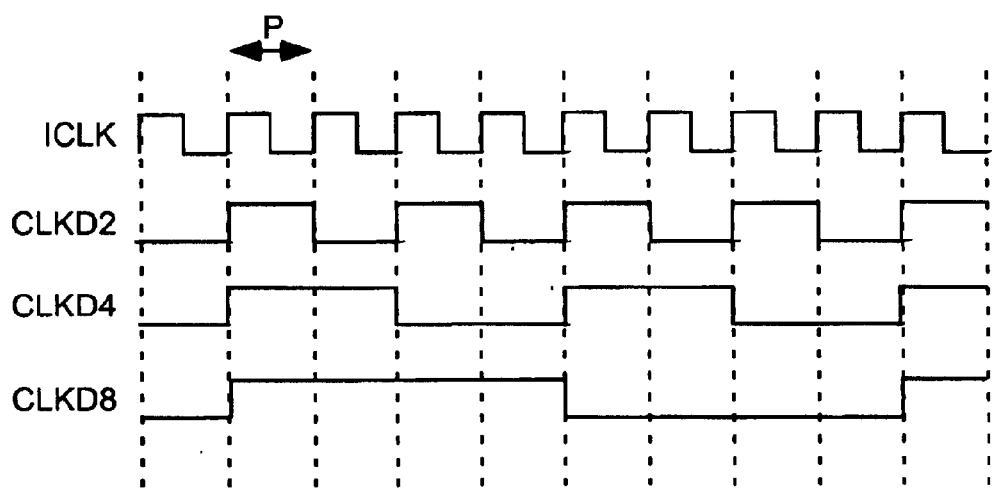
FIG. 1A is a timing diagram for the clock divider of FIG. 1.
Figure 2:
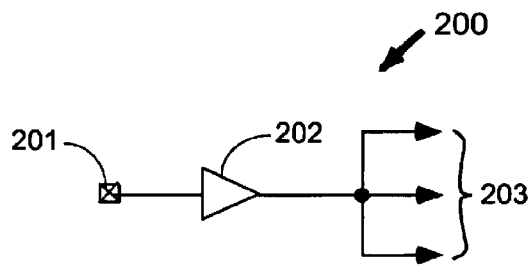
FIG. 2 is a block diagram of a conventional clock driver circuit not including a clock divider.

Control circuit 712 can be implemented using a counter similar, for example, to that shown in FIG. 1, and a decoder circuit that decodes the counter values to enable and disable passgates 702 and 703. Those of skill in the art of logic design could easily generate such an implementation. However, FIG. 7B illustrates a preferred approach in which control circuit 712 is implemented as a state machine.

Figure 7B:
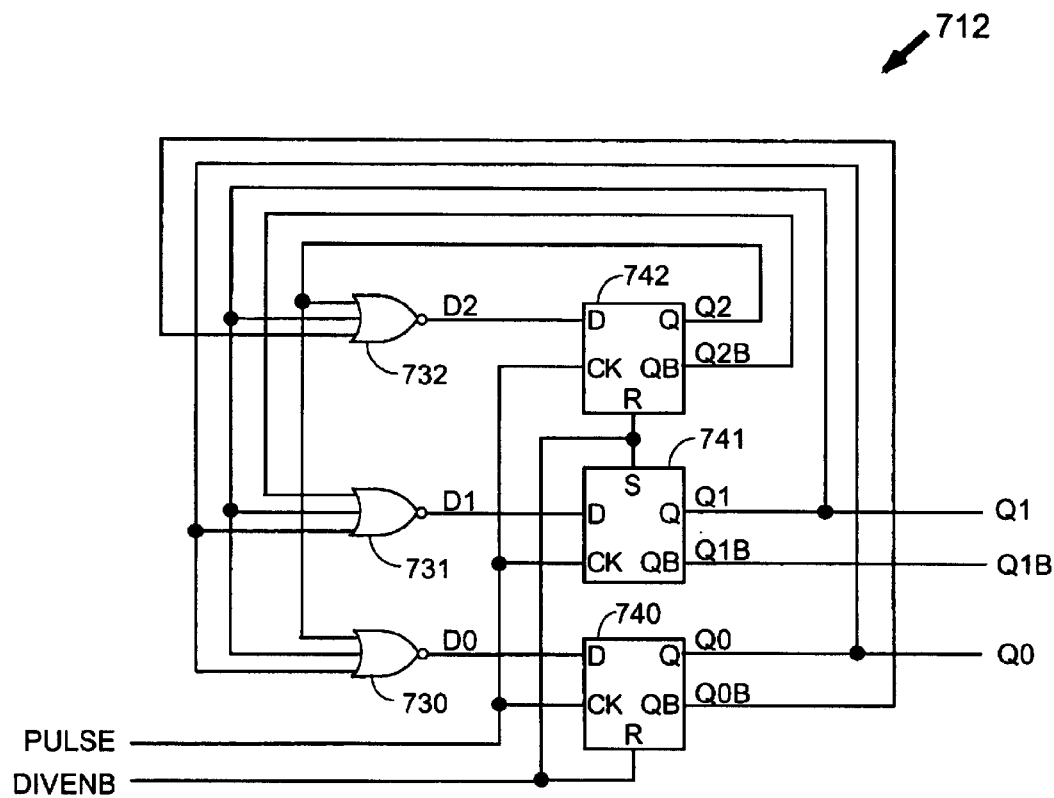
FIG. 7B shows one embodiment of a control circuit that can be used with the embodiment of FIG. 7 to implement a divide-by-two clock divider circuit.

The embodiment of control circuit 712 shown in FIG. 7B includes three flip-flops 740–742 providing signals Q0–Q2, respectively. Signals Q0 and Q2 are initialized to low values, and signal Q1 is initialized to a high value, when enable signal DIVENB is high. NOR gates 730–732 provide the next state values D0–D2, respectively, for flip-flops 740–742. NOR gate 730 implements the function D0=(Q2+Q1+Q0)'. NOR gate 731 implements the function D1=(Q2B+Q1+Q0)'. NOR 732 implements the function D2=(Q2+Q1+Q0B)'.

The sequence of states followed by control circuit 712 is shown in Table 1. The symbol "x" indicates a don't-care value.

TABLE 1

| DIVENB | Q2 | Q1 | Q0 | D2 | D1 | D0 | Selected Clock |
|---|---|---|---|---|---|---|---|
| 1 | 0 | 1 | 0 | x | x | x | True |
| 0 | 0 | 1 | 0 | 0 | 0 | 0 | True |
| 0 | 0 | 0 | 0 | 0 | 0 | 1 | Off |
| 0 | 0 | 0 | 1 | 1 | 0 | 0 | Complement |
| 0 | 1 | 0 | 0 | 0 | 1 | 0 | Off |

Note that three flip-flops are used to provide only states. While two flip-flops can provide four states, of these states is a "1,1" state (i.e., Q0 and Q1 would both be "1" in one of the four states). If a "1,1" state were used in the clock divider circuit of FIG. 7, a decoder would be required to convert the "1,1" state to a state where neither of passgates 702, 703 was enabled. Therefore, a third flip-flop is preferably used to distinguish between the two OFF states, i.e., between the state of "0,0 going to 0,1" and the state of "0,0 going to 1,0".

Figure 7C:
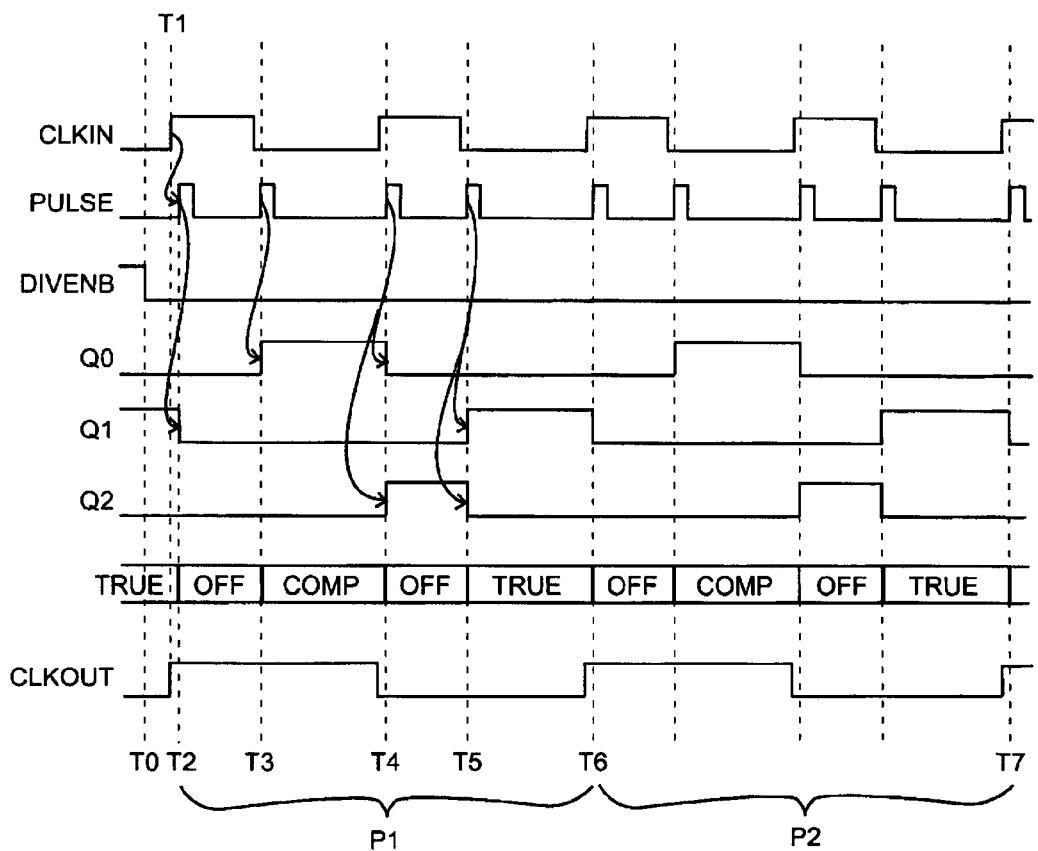
FIG. 7C is a timing diagram for the clock divider circuit of FIG. 7 when the control circuit of FIG. 7B is used.

FIG. 7C shows how the sequence of states shown in Table 1 results in a divide-by-two function for clock divider circuit 700 of FIG. 7. Referring back to FIG. 7, it can be seen that passgate 703 is enabled whenever signal Q1 is high, and passgate 702 is enabled whenever signal Q0 is high. The true input clock signal CLKIN is applied to passgate 703, and a complement clock signal (inverted by inverter 701) is applied to passgate 702. Thus, signal Q1 is also referred to as the "true enable" signal TRUEEN, and signal Q0 is also referred to as the "complement enable" signal COMPEN. Control circuit 712 as shown in FIG. 7B enables passgate 703 whenever a rising edge on signal CLKIN is to be passed, and enables passgate 702 whenever a falling edge on the complement of signal CLKIN is to be passed.

As shown in Table 1, control circuit 712 has four different states when enabled. In a first state, signal Q1 is high and signal Q0 is low. In a second state, signals Q1 and Q0 are both low and the next state will be the third state. In the third state, signal Q0 is high and signal Q1 is low. In a fourth state, signals Q1 and Q0 are both low and the next state will be the first state.

However, while control circuit 712 has four states, clock divider circuit 700 operates in one of three modes: the "TRUE" mode, corresponding to the first state of the control circuit (signal TRUEEN is high, passgate 703 is enabled, and the true clock signal is passed); the "COMP" mode, corresponding to the third state of the control circuit (signal COMPEN is high, passgate 702 is enabled, and the complement clock signal is passed); or the "OFF" mode, corresponding to the second and fourth states of the control circuit (signals TRUEEN and COMPEN are both low, neither of the two passgates is enabled, and keeper circuit 713 maintains the value of the CLKOUT signal).

As shown in FIG. 7C, prior to time T0 enable signal DIVENB is high, holding signals Q0 and Q2 low and signal Q1 high. The clock divider circuit is in TRUE mode, and signal CLKIN is passed to the CLKOUT terminal unchanged except for the delay caused by passgate 703. At time T0, signal DIVENB goes low and the clock divider circuit is enabled. At the next rising edge of input clock signal CLKIN (time T1), the rising edge is passed through passgate 703 and appears at the CLKOUT terminal.

Also in response to the rising edge of input clock signal CLKIN (time T1), a pulse is generated on signal PULSE (time T2), causing flip-flop 741 in control circuit 712 to change state, i.e., signal Q1 goes low. When signal Q1 (which is also signal TRUEEN) goes low, passgate 703 is disabled and the clock divider circuit enters the "OFF" mode.

The next falling edge of signal CLKIN does not result in a falling edge at the CLKOUT terminal, because the circuit is in the OFF mode. However, the resulting pulse on signal PULSE (time T3) causes flip-flop 740 to change state, i.e., signal Q0 goes high. When signal Q0 (which is also signal COMPEN) goes high, passgate 702 is enabled and the clock divider circuit enters the "COMP" mode.

At the next rising edge of input clock signal CLKIN, the complementary falling edge is passed through passgate 702 and appears at the CLKOUT terminal. The rising clock edge also generates a pulse on signal PULSE (time T4), which causes signal Q0 to go low and signal Q2 to go high. When signal Q0 (which is also signal COMPEN) goes low, passgate 702 is disabled and the clock divider circuit enters the "OFF" mode.

The next falling edge of signal CLKIN does not result in a falling edge at the CLKOUT terminal, because the circuit is in the OFF mode. However, the resulting pulse on signal PULSE (time T5) causes signal Q1 to go high and signal Q2 to go low. When signal Q1 (which is also signal TRUEEN) goes high, passgate 703 is enabled and the clock divider circuit enters the "TRUE" mode.

The next rising edge of input clock signal CLKIN is passed to the CLKOUT terminal. At time T6, the rising clock edge also generates a pulse on signal PULSE, which causes signal Q1 to go low and the clock divider circuit to return to the OFF mode. The cycle shown as period "P1" in FIG. 7C then repeats, for example, as period P2 between times T6 and T7. The cycle continues until signal DIVENB goes high again.

Figure 3:
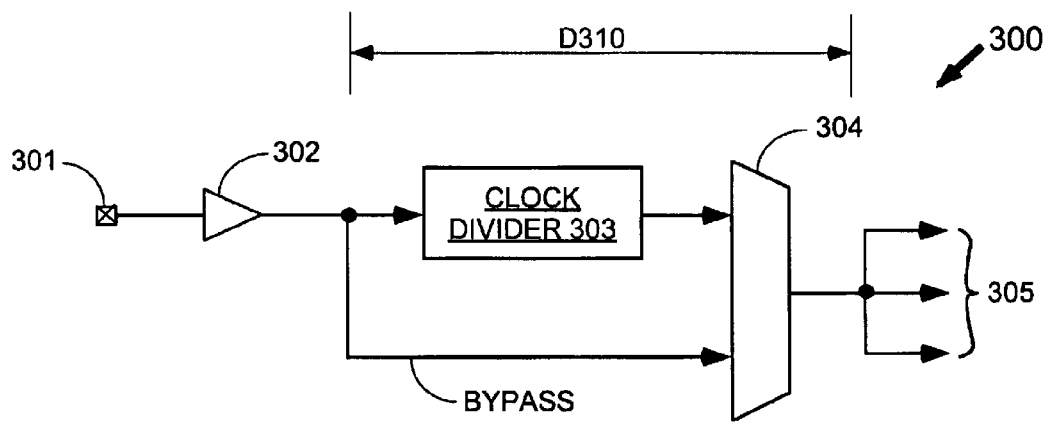
FIG. 3 is a block diagram of a conventional clock driver circuit including an optional clock divider.
Figure 4:
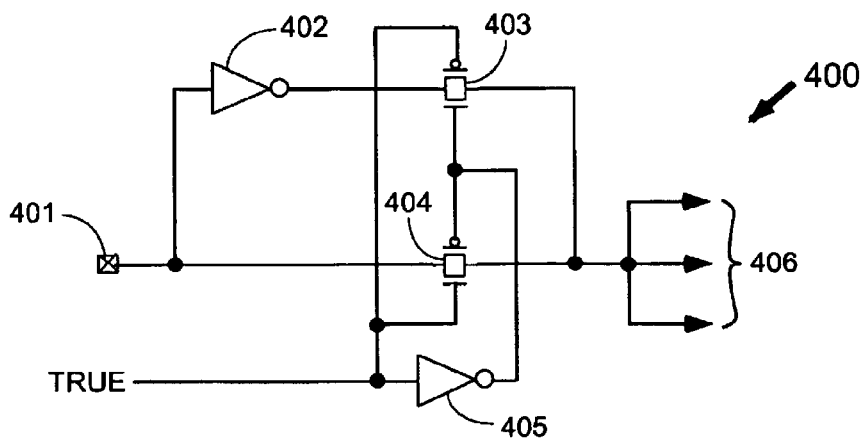
FIG. 4 is a block diagram of a conventional clock driver circuit that optionally inverts the clock signal.
Figure 5:
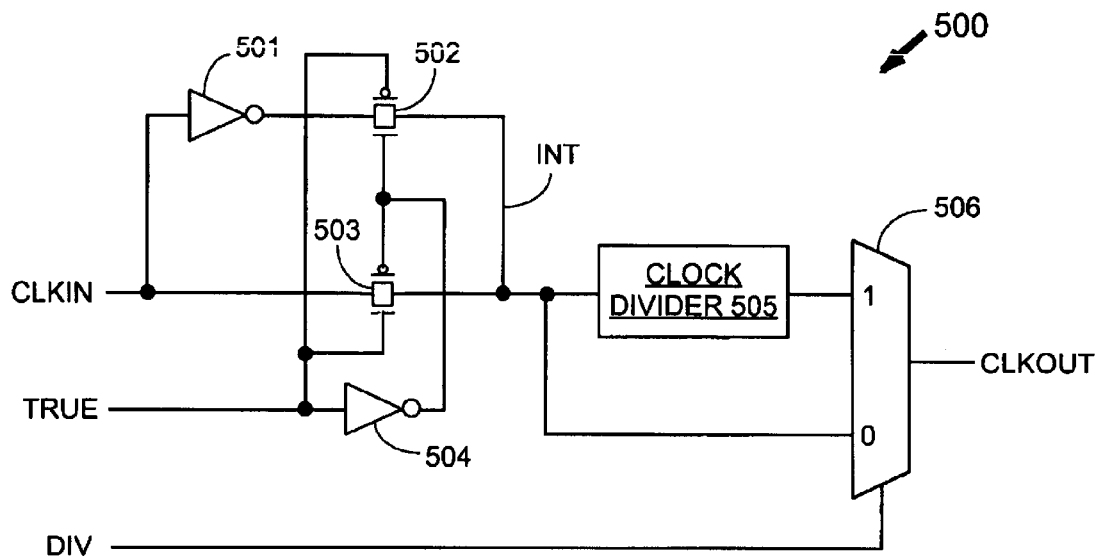
FIG. 5 is a block diagram of a first conventional clock divider circuit that optionally divides and optionally inverts the input clock signal.
Figure 6:
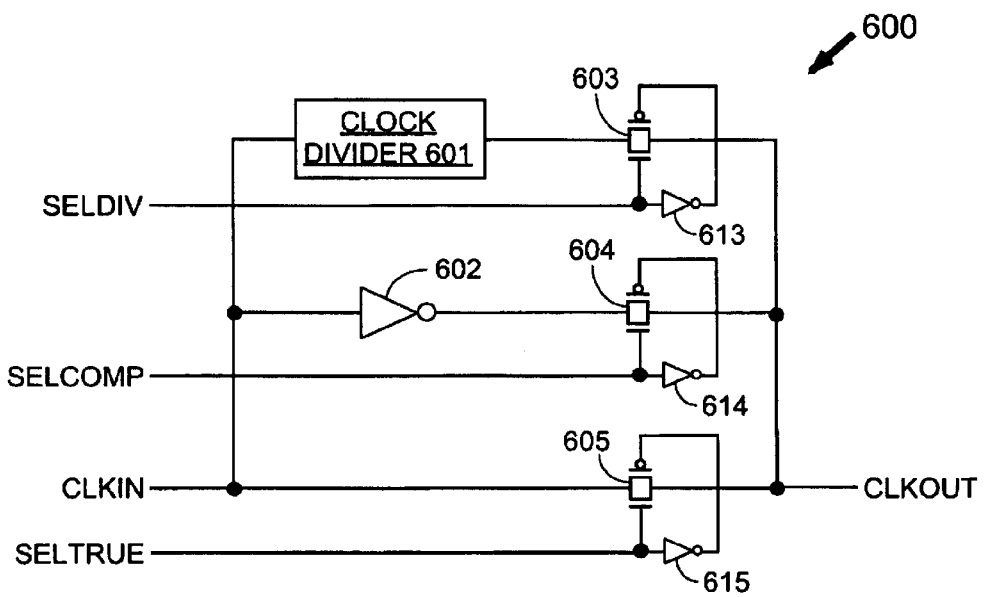
FIG. 6 is a block diagram of a second conventional clock divider circuit that optionally divides and optionally inverts the input clock signal.

Note that the delay through clock divider circuit 700 for a rising clock edge includes only the delay through passgate 703. The delay through clock divider circuit 700 for a falling clock edge includes only the delay through inverter 701 and passgate 702. Therefore, the clock delay of clock divider circuit 700 is significantly shorter than the clock delay through, for example, clock divider circuits 300, 500, and 600 of FIGS. 3, 5, and 6.

The novel circuit configuration of FIG. 7 has an additional advantage. In conventional clock dividers, the clock signal follows the same path through the divider for both falling and rising edges of the clock. Therefore, the circuit cannot be optimized for both edges. Instead, some compromise must be reached that provides acceptable performance on both edges of the clock. However, in the circuit shown in FIG. 7, passgates 702 and 703 are separately controlled. Therefore, the controlling transistors can each be optimized for the corresponding clock edge.

In other words, a rising edge on output clock signal CLKOUT is controlled by passgate 703, while a falling edge on output clock signal CLKOUT is controlled by inverter 701 and passgate 702. Therefore, passgate 703 can be optimized to improve the performance of the rising edge of output clock signal CLKOUT, while inverter 701 and passgate 702 can be optimized to improve the performance of the falling edge of output clock signal CLKOUT. This optimization can be achieved, for example, through well-known methods involving circuit simulations performed on a computer. One example of such optimization is the use of a CMOS passgate to implement passgate 703 and an N-channel transistor to implement passgate 702 in the embodiment of FIG. 7.

For all of these reasons, the clock delay through clock divider circuit 700 can be significantly less than the delay through conventional clock divider circuits. For example, the delay added to a clock divider circuit using a conventional clock divider is typically about 500 picoseconds. However, when the same manufacturing technology is used, the delay added when using clock divider 700 can be as little as 90 picoseconds.

Figure 8A:
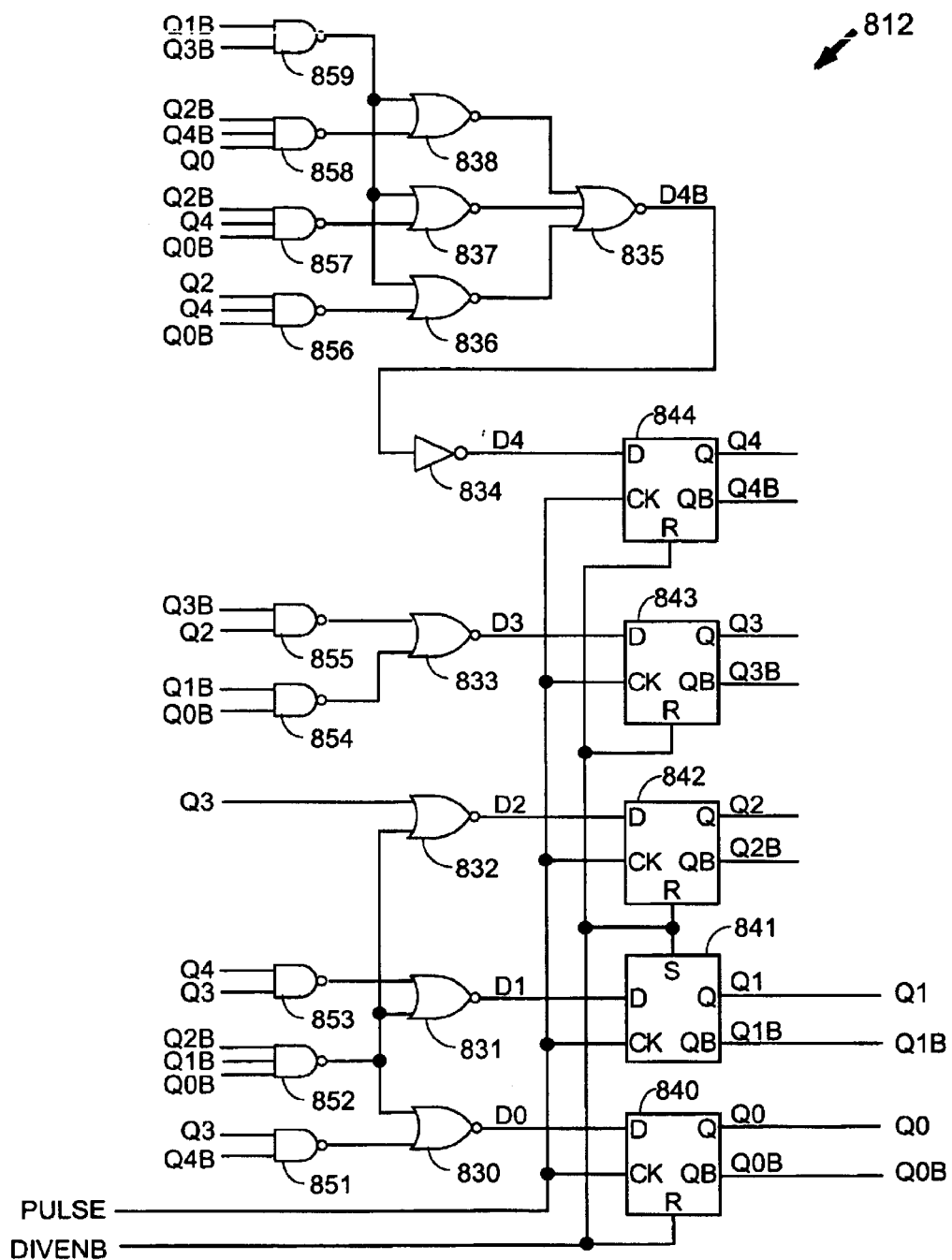
FIG. 8A shows one embodiment of a control circuit that can be used with the embodiment of FIG. 7 to implement a divide-by-four clock divider circuit.

The control circuit implementation shown in FIG. 7B can be applied to the clock divider circuit of FIG. 7 to provide a divide-by-two function. However, by using other control circuits, other divisors can be provided. For example, FIG. 8A shows a control circuit 812 that can be used with clock divider circuit 700 of FIG. 7 to implement a divide-by-four function.

Control circuit 812 is a state machine having eight different states when enabled. The sequence of states followed by control circuit 812 is shown in Table 2.

TABLE 2

| DIVENB | Q4 | Q3 | Q2 | Q1 | Q0 | D4 | D3 | D2 | D1 | D0 | Selected Clock |
|---|---|---|---|---|---|---|---|---|---|---|---|
| 1 | 0 | 0 | 0 | 1 | 0 | x | x | x | x | x | True |
| 0 | 0 | 0 | 0 | 1 | 0 | 0 | 0 | 0 | 0 | 0 | True |
| 0 | 0 | 0 | 0 | 0 | 0 | 0 | 0 | 1 | 0 | 0 | Off |
| 0 | 0 | 0 | 1 | 0 | 0 | 0 | 1 | 0 | 0 | 0 | Off |
| 0 | 0 | 1 | 0 | 0 | 0 | 0 | 0 | 0 | 0 | 1 | Off |
| 0 | 0 | 0 | 0 | 0 | 1 | 1 | 0 | 0 | 0 | 0 | Complement |
| 0 | 1 | 0 | 0 | 0 | 0 | 1 | 0 | 1 | 0 | 0 | Off |
| 0 | 1 | 0 | 1 | 0 | 0 | 1 | 1 | 0 | 0 | 0 | Off |
| 0 | 1 | 1 | 0 | 0 | 0 | 0 | 0 | 0 | 1 | 0 | Off |

The control circuit 812 shown in FIG. 8A includes five flip-flops 840–844 providing signals Q0–Q4, respectively. Signals Q0 and Q2–Q4 are initialized to low values, and signal Q1 is initialized to a high value, when enable signal DIVENB is high. NOR gates 830–833 and inverter 834 provide the next state values D0–D4, respectively, for flip-flops 840–844.

NOR gate 830 and NAND gates 851, 852 implement the function ((Q3*Q4B)'+(Q2B*Q1B*Q0B)')'. NOR gate 831 and NAND gates 852, 853 implement the function ((Q2B*Q1B*Q0B)'+(Q4*Q3)')'. NOR gate 832 and NAND gate 852 implement the function ((Q2B*Q1B*Q0B)'+Q3)'. NOR gate 833 and NAND gates 854, 855 implement the function ((Q1B*Q0B)'+(Q3B*Q2)')'. Inverter 834, NOR gates 835–838, and NAND gates 856–859 implement the function (((Q2*Q4*Q0B)'+(Q1B*Q3B)')'+((Q2B*Q4*Q0B)'+(Q1B*Q3B)')'+((Q2B*Q4B*Q0)'+(Q1B*Q3B)')')

Figure 8B:
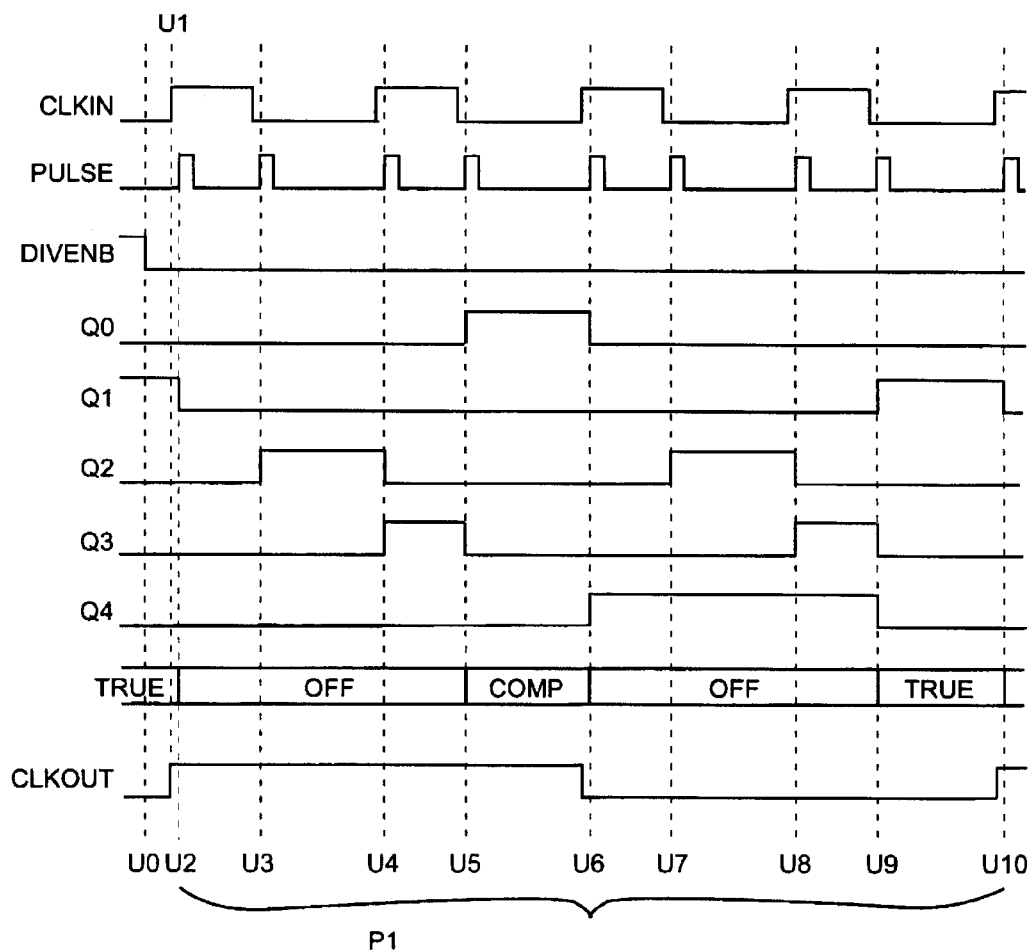
FIG. 8B is a timing diagram for the clock divider circuit of FIG. 7 when the control circuit of FIG. 8A is used.

FIG. 8B shows how the sequence of states shown in Table 2 results in a divide-by-four function for clock divider circuit 700 of FIG. 7. As with control circuit 712 of FIG. 7B, at any given time the clock divider circuit that uses control circuit 812 is operating in either a TRUE mode, a COMP mode, or an OFF mode.

Control circuit 812 differs from control circuit 712 in that the number of OFF states is increased from two to six. As can be seen from the waveforms of FIG. 8B, this increased number of OFF states results in a CLKOUT output waveform having twice the period of that shown in FIG. 7C.

As will be clearly understood by those of skill in the relevant arts, the exemplary state machines shown in FIGS. 7B and 8A are only two examples of state machines that can be used to implement clock divider circuits. For example, Table 3 shows a state table for a state machine having twelve different states when enabled. When used with clock divider circuit 700 of FIG. 7, the state machine of Table 3 results in a divide-by-six clock divider circuit.

TABLE 3

| DIVENB | Q5 | Q4 | Q3 | Q2 | Q1 | Q0 | D5 | D4 | D3 | D2 | D1 | D0 | Selected Clock |
|---|---|---|---|---|---|---|---|---|---|---|---|---|---|
| 1 | 0 | 0 | 0 | 0 | 1 | 0 | x | x | x | x | x | x | True |
| 0 | 0 | 0 | 0 | 0 | 1 | 0 | 0 | 0 | 0 | 0 | 0 | 0 | True |
| 0 | 0 | 0 | 0 | 0 | 0 | 0 | 0 | 0 | 0 | 1 | 0 | 0 | Off |
| 0 | 0 | 0 | 0 | 1 | 0 | 0 | 0 | 0 | 1 | 0 | 0 | 0 | Off |
| 0 | 0 | 0 | 1 | 0 | 0 | 0 | 0 | 0 | 1 | 1 | 0 | 0 | Off |
| 0 | 0 | 0 | 1 | 1 | 0 | 0 | 0 | 1 | 0 | 0 | 0 | 0 | Off |
| 0 | 0 | 1 | 0 | 0 | 0 | 0 | 0 | 0 | 0 | 0 | 0 | 1 | Off |
| 0 | 0 | 0 | 0 | 0 | 0 | 1 | 1 | 0 | 0 | 0 | 0 | 0 | Complement |
| 0 | 1 | 0 | 0 | 0 | 0 | 0 | 1 | 0 | 0 | 1 | 0 | 0 | Off |
| 0 | 1 | 0 | 0 | 1 | 0 | 0 | 1 | 0 | 1 | 0 | 0 | 0 | Off |
| 0 | 1 | 0 | 1 | 0 | 0 | 0 | 1 | 0 | 1 | 1 | 0 | 0 | Off |
| 0 | 1 | 0 | 1 | 1 | 0 | 0 | 1 | 1 | 0 | 0 | 0 | 0 | Off |
| 0 | 1 | 1 | 0 | 0 | 0 | 0 | 0 | 0 | 0 | 0 | 1 | 0 | Off |

Figure 9:
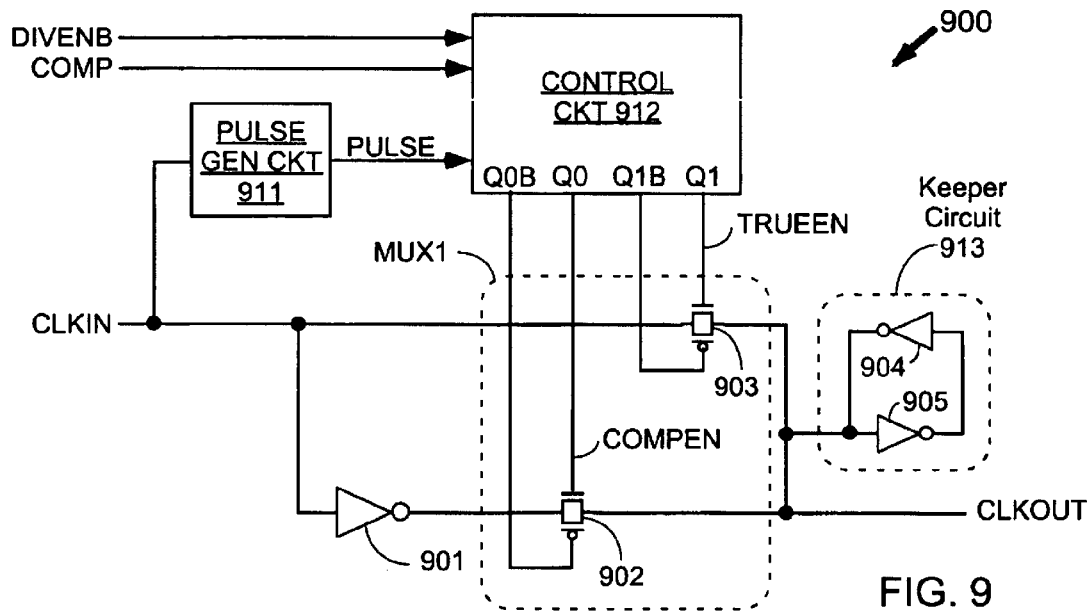
FIG. 9 is a block diagram of a clock divider circuit according to a third embodiment of the invention.

FIG. 9 shows a clock divider circuit 900 according to another embodiment of the invention. Clock divider circuit 900 is similar to clock divider circuit 700 of FIG. 7, except that multiplexer circuit MUX1 is implemented using two CMOS passgates 902, 903. Thus, an additional control signal Q0B is required. For simplicity, other portions of circuit 900 similar to those previously described in connection with FIG. 7 are not further described.

If the same control circuits are used in FIGS. 7 and 9, the circuits will behave similarly. However, because passgate 902 is a CMOS passgate, both rising and falling edges can quickly be passed through passgate 902, and both edges can overcome the weak driver 904 in keeper circuit 913. Therefore, clock divider circuit 900 can have an added capability. When the clock divider function is disabled, the circuit of FIG. 9 can optionally pass either the true or the complement version of input clock signal CLKIN to output terminal CLKOUT. In the illustrated embodiment, when select signal COMP is high, the complement version of input clock signal CLKIN is passed. When select signal COMP is low, the true version of input clock signal CLKIN is passed to output terminal CLKOUT.

As described in the background section of the present specification, clock divider divide-by-two circuits can advantageously be included in PLDs, dividing down the input clock for distribution within the PLD, then doubling the clock frequency again only where required by the user logic. Another capability typically included in PLDs is the ability to programmably invert the input clock prior to distribution. This capability is typically provided by routing the clock signal through a multiplexer controlled by a configuration memory cell to select either the true or the complement clock signal. Note that the embodiment of FIGS. 9 and 9A provides this true/complement select capability and the selectable divide-by-two capability as well, with no more delay than with the simple multiplexer circuit of the prior art.

In one embodiment, clock divider circuit 900 is included in a PLD, and the COMP select signal is provided by a configuration memory cell.

Figure 9A:
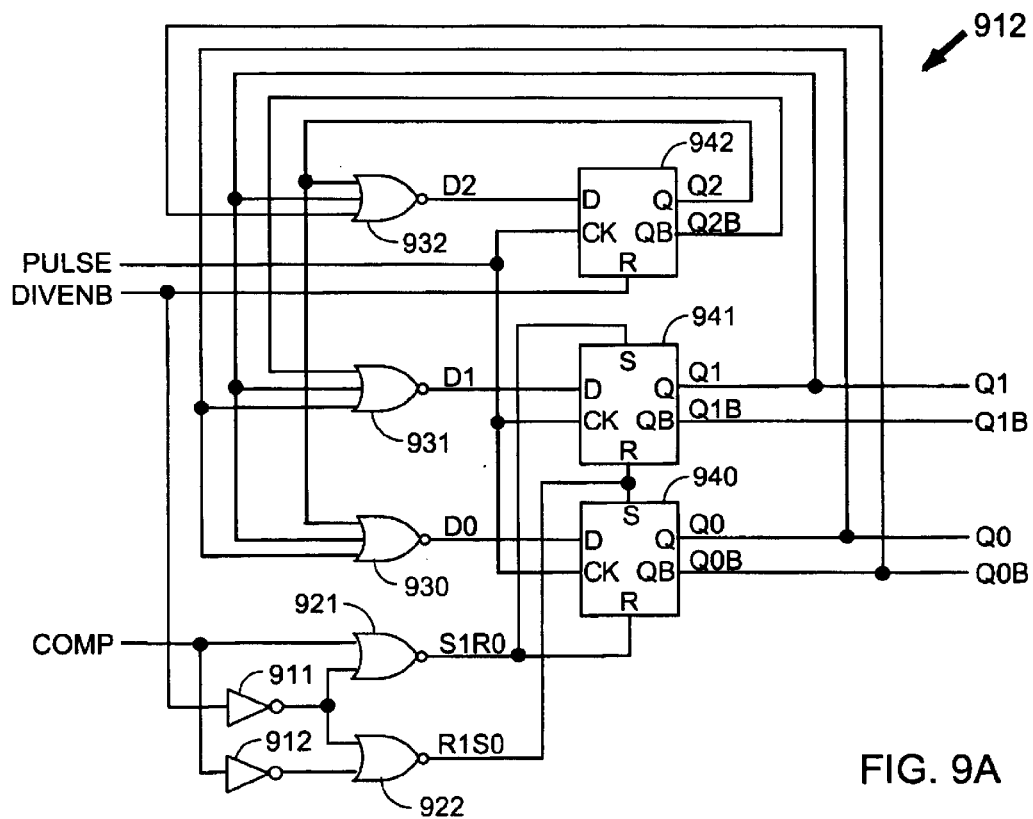
FIG. 9A shows one embodiment of a control circuit that can be used with the embodiment of FIG. 9 to implement a second divide-by-two clock divider circuit.

FIG. 9A shows one implementation of control circuit 912, where the control circuit is implemented as a state machine similar to that of FIG. 7B. Flip-flops 940–942 and NOR gates 930–932 are coupled together in a fashion similar to that of control circuit 712 of FIG. 7B. However, the set and reset signals of flip-flops 940 and 941 are derived differently, to accommodate the additional functionality. Table 4 shows the functionality of control circuit 912 of FIG. 9A.

TABLE 4

| DIVENB | COMP | Q2 | Q1 | Q0 | D2 | D1 | D0 | Selected Clock |
|---|---|---|---|---|---|---|---|---|
| 1 | 1 | 0 | 0 | 1 | x | x | x | Comp |
| 1 | 0 | 0 | 1 | 0 | x | x | x | True |
| 0 | x | 0 | 1 | 0 | 0 | 0 | 0 | True |
| 0 | x | 0 | 0 | 0 | 0 | 0 | 1 | Off |
| 0 | x | 0 | 0 | 1 | 1 | 0 | 0 | Complement |
| 0 | x | 1 | 0 | 0 | 0 | 1 | 0 | Off |

When the divide-by-two function is enabled (i.e., signal DIVENB is low), inverter 911 provides a high value to NOR gates 921 and 922, driving set/reset signals S1R0 and R1S0 low, respectively. Thus, select signal COMP is a don't-care value. When the divide-by-two function is disabled i.e., signal DIVENB is high), the value of select signal COMP determines the values of set/reset signals S1R0 and R1S0.

When signal DIVENB is high and signal COMP is high (i.e., the complement clock signal is selected), NOR gate 921 drives set/reset signal S1R0 low, while inverter 912 provides a low value to NOR gate 922. Because signal DIVENB is high, inverter 911 also provides a low value, and NOR gate 922 drives set/reset signal R1S0 high. Flip-flop 940 sets signal Q0 high, while flip-flop 941 resets signal Q1 low. Passgate 902 is enabled to pass the complement clock signal, while passgate 903 is disabled.

When signal DIVENB is high and signal COMP is low (i.e., the true clock signal is selected), inverter 912 provides a high value to NOR gate 922, which drives set/reset signal R1S0 low. Because signal DIVENB is high, inverter 911 provides a low value, and NOR gate 921 drives set/reset singal S1R0 high. Flip-flop 940 resets signal Q0 low, while flip-flop 941 sets signal Q1 high. Passgate 903 is enabled to pass the true clock signal, while passgate 902 is disabled.

As has been demonstrated by the above examples, many different control circuits can be used with the clock divider circuits of the invention, imparting different capabilities to the circuits. For example, in the embodiments described above, the control circuit accommodates only one divisor. In other embodiments (not shown), the control circuit is implemented as a programmable state machine supporting a plurality of divisors.

In some embodiments, the clock divider circuit of the invention forms a portion of a programmable logic device (PLD) such as a field programmable gate array (FPGA) or a complex programmable logic device (CPLD). In one such embodiment, the control circuit is implemented using user-controlled programmable logic to perform a specific function in a particular design, and supports only one divisor.

In another PLD embodiment, the control circuit is implemented in dedicated logic (i.e., not using the user-controlled logic blocks). This dedicated logic, however, can be designed to be programmable. For example, in some embodiments a clock divider circuit is implemented in dedicated logic in a PLD. The clock divider circuit includes a state machine that is configurable to support any of several divisors.

In one such embodiment, where the PLD is a CPLD, the state machine is controlled by logic values stored in FLASH memory using the typical programming process for the CPLD. In this embodiment, the logic values are included in the CPLD configuration data file. In another such embodiment, where the PLD is an FPGA, the state machine is controlled by logic values stored in SRAM cells during the normal configuration process for the FPGA. In this embodiment, the logic values are loaded as part of a configuration bitstream.

Those having skill in the relevant arts of the invention will now perceive various modifications and additions that can be made as a result of the disclosure herein. For example, the above text describes the circuits and methods of the invention in the context of integrated circuits (ICs) such as programmable logic devices (PLDs). However, the circuits of the invention can also be implemented in other electronic systems, for example, in printed circuit boards and larger electronic systems.

Further, pulse generator circuits, multiplexers, multiplexer circuits, control circuits, state machines, state machine circuits, keeper circuits, passgates, CMOS passgates, N-channel transistors, inverters, NAND gates, NOR gates, and other components other than those described herein can be used to implement the invention. Active-high signals can be replaced with active-low signals by making straightforward alterations to the circuitry, such as are well known in the art of circuit design.

Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A clock divider circuit, comprising:
   a true clock input terminal;
   a complement clock input terminal;
   a clock output terminal;
   a pulse generator circuit having an input terminal coupled to the true clock input terminal and further having an output terminal;
   a control circuit having an input terminal coupled to the output terminal of the pulse generator circuit, and further having first and second output terminals;
   a first passgate coupled between the true clock input terminal and the clock output terminal, the first passgate having a control terminal coupled to the first output terminal of the control circuit;
   a second passgate coupled between the complement clock input terminal and the clock output terminal, the second passgate having a control terminal coupled to the second output terminal of the control circuit; and
   a keeper circuit having an output terminal coupled to the clock output terminal.

2. The clock divider circuit of claim 1, further comprising an inverter coupled between the true and complement clock input terminals.

3. The clock divider circuit of claim 1, wherein the pulse generator circuit is a one-shot circuit responsive to both rising and falling edges of a signal on the true clock input terminal.

4. The clock divider circuit of claim 1, wherein:
   the control circuit comprises a state machine circuit having at least four states;
   in a first state the state machine circuit places an enable signal on the first output terminal and a disable signal on the second output terminal of the control circuit;
   in a second state the state machine circuit places disable signals on each of the first and second output terminals of the control circuit, and the next state will be a third state;
   in the third state the state machine circuit places an enable signal on the second output terminal and a disable signal on the first output terminal of the control circuit; and
   in a fourth state the state machine circuit places disable signals on each of the first and second output terminals of the control circuit, and the next state will be the first state.

5. The clock divider circuit of claim 4; wherein:
   in fifth, sixth, seventh, and eighth states the state machine circuit places disable signals on each of the first and second output terminals of the control circuit;
   the next state after the fifth state will be the sixth state;
   the next state after the sixth state will be the second state;
   the next state after the seventh state will be the eighth state; and
   the next state after the eighth state will be the fourth state.

6. The clock divider circuit of claim 1, wherein the control circuit includes a programmable divisor selection circuit.

7. The clock divider circuit of claim 1, wherein the control circuit comprises a counter circuit followed by a decoder circuit.

8. The clock divider circuit of claim 1, wherein the clock divider circuit forms a portion of a programmable logic device (PLD).

9. The clock divider circuit of claim 1, wherein the first passgate comprises a CMOS passgate.

10. The clock divider circuit of claim 1, wherein the second passgate comprises one of a CMOS passgate and an N-channel transistor.

11. The clock divider circuit of claim 1, wherein the keeper circuit comprises a pair of cross-coupled inverters.

12. The clock divider circuit of claim 1, wherein the clock divider circuit is one of a divide-by-two circuit, a divide-by-four circuit, and a divide-by-six circuit.

13. A clock divider circuit having first, second, third, and fourth states, comprising:
   a clock input terminal;
   a clock output terminal;
   first means, coupled between the clock input terminal and the clock output terminal, for providing a clock signal on the clock input terminal to the clock output terminal in a non-inverted form when the clock divider circuit is in the first state;

second means, coupled between the clock input terminal and the clock output terminal, for providing the clock signal on the clock input terminal to the clock output terminal in an inverted form when the clock divider circuit is in the third state;

means, coupled to the clock output terminal, for maintaining the value of a signal on the clock output terminal when the clock divider circuit is in the second and fourth states; and means, coupled to the clock input terminal and to the first and second means, for cycling the clock divider circuit through the first, second, third, and fourth states, in the stated order and in a repeating pattern, in response to signal edges received on the clock input terminal.

14. The clock divider circuit of claim 13, further comprising means for disabling the means for cycling and for placing the clock signal on the clock input terminal onto the clock output terminal.

15. A divide-by-N clock divider circuit, where N is an even integer, comprising:

a clock input terminal providing a clock input signal having alternating rising and falling edges;

a clock output terminal;

first means, coupled between the clock input terminal and the clock output terminal, for providing a first rising edge on the clock input signal to the clock output terminal in a non-inverted form in response to every Nth rising edge on the clock input signal;

second means, coupled between the clock input terminal and the clock output terminal, for providing a second rising edge on the clock input signal to the clock output terminal in an inverted form in response to every Nth rising edge on the clock input signal, the second rising edge being offset from the first rising edge by N/2 rising edges of the clock input signal; and means, coupled to the clock output terminal, for maintaining the value of a signal on the clock output terminal when neither the first nor the second means provides the clock input signal to the clock output terminal.

16. The divide-by-N clock divider circuit of claim 15, wherein N is one of two, four, and six.

17. The divide-by-N clock divider circuit of claim 15, further comprising means for selecting a value of N from a plurality of supported values.

18. The divide-by-N clock divider circuit of claim 15, further comprising means for disabling the second means and for utilizing the first means to provide the clock input signal to the clock output terminal in a non-inverted form.

19. The divide-by-N clock divider circuit of claim 15, further comprising means for disabling the first means and for utilizing the second means to provide the clock input signal to the clock output terminal in an inverted form.

20. An electronic system, comprising:

a pulse generator circuit having an input terminal coupled to receive a true clock signal and an output terminal coupled to provide a clock pulse in response to each rising and falling edge on the true clock signal;

a control circuit having an input terminal coupled to the output terminal of the pulse generator circuit, and further having first and second output terminals providing first and second control signals;

a multiplexer circuit having data input terminals coupled to receive the true clock signal and a complement clock signal that is the inverse of the true clock signal, the multiplexer circuit further having an output terminal, the multiplexer circuit being coupled to pass to the output terminal the true clock signal in response to an enable value on the first control signal and the complement clock signal in response to an enable value on the second control signal; and a keeper circuit having an output terminal coupled to the output terminal of the multiplexer circuit.

21. The electronic system of claim 20, further comprising an inverter circuit coupled to provide the complement clock signal from the true clock signal.

22. The electronic system of claim 20, wherein:

the control circuit comprises a state machine circuit having at least four states;

in a first state the state machine circuit places an enable signal on the first output terminal and a disable signal on the second output terminal of the control circuit;

in a second state the state machine circuit places disable signals on each of the first and second output terminals of the control circuit, and the next state will be a third state;

in the third state the state machine circuit places an enable signal on the second output terminal and a disable signal on the first output terminal of the control circuit; and in a fourth state the state machine circuit places disable signals on each of the first and second output terminals of the control circuit, and the next state will be the first state.

23. The electronic system of claim 22, wherein:

in fifth, sixth, seventh, and eighth states the state machine circuit places disable signals on each of the first and second output terminals of the control circuit;

the next state after the fifth state will be the sixth state;

the next state after the sixth state will be the second state;

the next state after the seventh state will be the eighth state; and the next state after the eighth state will be the fourth state.

24. The electronic system of claim 20, wherein:

the electronic system comprises a programmable logic device (PLD); and the control circuit includes a programmable divisor selection circuit.

25. The electronic system of claim 20, wherein the control circuit comprises a counter circuit followed by a decoder circuit.

26. The electronic system of claim 20, wherein the multiplexer circuit comprises:

a first passgate having a control terminal coupled to receive the first control signal and further being coupled to selectively pass the true clock signal to the output terminal of the multiplexer circuit; and a second passgate having a control terminal coupled to receive the second control signal and further being coupled to selectively pass the complement clock signal to the output terminal of the multiplexer circuit.

27. The electronic system of claim 26, wherein the first passgate is a CMOS passgate and the second passgate is an N-channel transistor.

* * * * *